United States Patent
Yeo et al.

(10) Patent No.: US 7,892,901 B2
(45) Date of Patent: Feb. 22, 2011

(54) STRAINED SILICON-ON-INSULATOR TRANSISTORS WITH MESA ISOLATION

(75) Inventors: Yee-Chia Yeo, Singapore (SG); Chenming Hu, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 11/604,161

(22) Filed: Nov. 25, 2006

(65) Prior Publication Data

US 2007/0190702 A1  Aug. 16, 2007

Related U.S. Application Data

(62) Division of application No. 10/356,036, filed on Jan. 31, 2003, now Pat. No. 7,157,774.

(51) Int. Cl.
*H01L 21/00* (2006.01)
*H01L 21/84* (2006.01)

(52) U.S. Cl. ............... 438/164; 438/421; 257/E21.564

(58) Field of Classification Search ......... 438/149–166, 438/295, 311, 404–413, 458–459, 479–481, 438/674, 675, 678, 967, 319, 421; 257/347, 257/353, 618, 623, E21.564, E21.377, 383, 257/354, E21.573, E21.618, E21.628, E21.633, 257/E21.642

See application file for complete search history.

(56) References Cited

U.S. PATENT DOCUMENTS

| | | | |
|---|---|---|---|
| 4,753,896 A * | 6/1988 | Matloubian | 438/149 |
| 6,271,065 B1 * | 8/2001 | Miyamoto et al. | 438/164 |
| 6,492,210 B2 * | 12/2002 | Wieczorek et al. | 438/149 |
| 6,509,583 B1 * | 1/2003 | Iwamatsu et al. | 257/59 |
| 6,521,510 B1 * | 2/2003 | Fisher et al. | 438/424 |
| 6,602,745 B2 * | 8/2003 | Thwaite et al. | 438/182 |
| 6,624,478 B2 * | 9/2003 | Anderson et al. | 257/353 |
| 6,727,550 B2 * | 4/2004 | Tezuka et al. | 257/347 |
| 7,112,817 B2 * | 9/2006 | Yamazaki et al. | 257/59 |
| 2002/0168802 A1 * | 11/2002 | Hsu et al. | 438/149 |
| 2003/0059988 A1 * | 3/2003 | Hsu | 438/154 |
| 2003/0207548 A1 * | 11/2003 | Ipposhi et al. | 438/479 |
| 2004/0005740 A1 * | 1/2004 | Lochtefeld et al. | 438/149 |
| 2004/0018668 A1 * | 1/2004 | Maszara | 438/149 |
| 2006/0197126 A1 * | 9/2006 | Lochtefeld et al. | 257/288 |
| 2008/0286956 A1 * | 11/2008 | Yamazaki | 438/595 |
| 2009/0004788 A1 * | 1/2009 | Madurawe | 438/164 |

FOREIGN PATENT DOCUMENTS

WO    WO 02080241 A1    10/2002

OTHER PUBLICATIONS

Definition of the preposition "on"; Dictionary.com.*

* cited by examiner

*Primary Examiner*—Matthew C Landau
*Assistant Examiner*—Joseph C Nicely
(74) *Attorney, Agent, or Firm*—Tung & Associates

(57) ABSTRACT

A silicon-on-insulator semiconductor device which includes a substrate; an insulator layer overlying the substrate; a plurality of strained silicon islands overlying the insulator layer, the strained silicon islands are isolated from each other by mesa isolation; and a plurality of transistors formed on the strained silicon islands. A method for fabricating the silicon-on-insulator semiconductor device is further disclosed.

19 Claims, 3 Drawing Sheets

STRAINED SILICON-ON-INSULATOR TRANSISTORS WITH MESA ISOLATION

This is a Divisional of application Ser. No. 10/356,036 filed on Jan. 31, 2003 now U.S. Pat. No. 7,157,774.

FIELD OF THE INVENTION

The present invention generally relates to semiconductor devices and a method for making the same. More particularly, the invention is related to strained silicon-on-insulator transistors formed with mesa isolation.

BACKGROUND OF THE INVENTION

Complementary metal-oxide-semiconductor (CMOS) technology is the dominant semiconductor technology used for the manufacture of ultra-large scale integrated (ULSI) circuits today. Size reduction of the metal-oxide-semiconductor field-effect transistor (MOSFET) has provided significant improvement in the speed performance, circuit density, and cost per unit function of semiconductor chips over the past few decades. Significant challenges are faced when CMOS devices are scaled into the sub-100 nm regime. An attractive approach for additional improvement of CMOS transistor performance exploits strain-induced band-structure modification and mobility enhancement to increase the transistor drive current. Enhanced electron and hole mobility in silicon (Si) under biaxial tensile strain can be achieved. Enhanced electron and hole mobilities improve the drive currents of N-channel and P-channel MOSFETs, respectively.

Various designs of strained silicon layers for transistor fabrication utilize thick buffer layers or complex multi-layer structures on bulk silicon substrates. As shown in FIG. 1A, a device 10 utilizing conventional strained Si substrate technology employs a thick silicon-germanium (SiGe) graded buffer layer 12 with thickness in the order of micrometers formed on a Si substrate 14. Such a thick graded buffer layer 12 requires an extended length of time, i.e., of several tens of minutes to several hours, to grow and is an expensive process. A relaxed SiGe layer 16 is then deposited over the graded buffer layer 12. The relaxed SiGe layer 16 has a larger natural lattice constant than that of silicon. As a result, a thin layer 18 of silicon that is epitaxially grown on the relaxed SiGe layer 16 will be under biaxial tensile strain. This is shown in FIG. 1B. Transistors fabricated on this strained silicon layer 18 will have enhanced electrical performance. However, such a substrate might not be easily or economically introduced into a conventional CMOS process. The integration of strained layers into a conventional CMOS process introduce significant difficulties. This is because conventional CMOS process utilize high processing temperatures, especially during the formation of isolation structures.

Isolation structures such as shallow trench isolation (STI), local oxide of silicon (LOCOS), and their variants are in widespread use on bulk substrates today. High temperatures favor the relaxation of strained layers and the formation of dislocations. The dislocation density in strained layers has been observed to increase with prolonged annealing at high temperatures. Since starting substrates with strained layers are subjected to the high thermal budget of the isolation formation process, the integration of strained layers on bulk substrates is very challenging. In U.S. Pat. No. 6,429,061, the strained silicon layer is grown selectively after isolation structures are formed to avoid the high temperatures of the isolation formation process. In spite of this, U.S. Pat. No. 6,429,061 employs an expensive thick SiGe buffer layer and a selective strained silicon epitaxial process.

Another type of substrate, silicon-on-insulator (SOI) substrates, though offer several advantages over bulk substrates, are not as widely used as bulk substrates. In SOI technology, MOSFETs are formed on a thin layer of silicon overlying a layer of insulating material such as silicon oxide. Devices formed on SOI substrates offer many advantages over their bulk counterparts, including reduced junction capacitance, absence of reverse body effect, soft-error immunity, full dielectric isolation, and absence of latch-up. SOI technology therefore enables higher speed performance, higher packaging density, and reduced power consumption. Since it is not straightforward to incorporate a strained silicon layer on a SOI substrate, strained silicon-on-insulator (SSOI) substrates are in an initial stage of research.

Others have attempted to fabricate transistors on a strained silicon layer overlying two SiGe layers with different Ge contents which is provided on an insulator layer. In U.S. Pat. No. 6,410,371, a method of forming a semiconductor-on-insulator (SOI) wafer with a Si/SiGe/Si heterostructure is disclosed, where the topmost silicon layer is strained. These works teach the formation of SOI substrates comprising of Si and SiGe layers where the Si layer is strained. The presence of SiGe in the semiconductor layer introduces problems in the formation of liner oxide in the STI process. STI process also potentially relaxes the strained silicon layer.

MOSFETs with strained silicon channels have enhanced carrier mobilities. Most of the research work on strained silicon transistors employed bulk substrates, where a pseudo-morphic strained silicon layer is epitaxially grown on a relaxed silicon-germanium (Si—Ge) layer. The relaxed SiGe layer overlies a thick SiGe graded buffer layer on a silicon substrate (as shown in FIGS. 1A and 1B). Such bulk substrates employ isolation structures such as shallow trench isolation (STI) to isolate devices from one another. The STI formation process typically comprises of a trench formation step, a liner oxide formation step, a trench filling step, and an annealing step. The liner oxide formation step, in the case of the strained silicon substrate, involves the oxidation of SiGe. This results in a liner oxide of poor quality and leads to leakage problems and poor device isolation.

Research work on a SiGe-free SOI substrate where strained silicon is incorporated has also been reported. The elimination of SiGe in the semiconductor layer of the SOI substrate alleviates problems with liner oxide formation in the STI process. However, the STI process still involves high temperatures that might relax the strained silicon layer.

It is therefore an object of the present invention to provide a silicon-on-insulator semiconductor device utilizing strained silicon technology.

It is another object of the present invention to provide a silicon-on-insulator semiconductor device that can be fabricated without the drawbacks or shortcomings of the conventional manufacturing methods.

It is a further object of the present invention to provide de a highly manufacturable strained silicon-on-insulator transistor with mesa isolation.

It is another further object of the present invention to provide a fabrication process for strained silicon-on-insulator technology with reduced thermal budget.

SUMMARY OF THE INVENTION

In accordance with the present invention, a silicon-on-insulator semiconductor device and a method for fabricating the device are provided.

In a preferred embodiment, a silicon-on-insulator semiconductor device is provided which includes a substrate; an insulator layer overlying the substrate; a plurality of strained silicon islands overlying the insulator layer, the strained silicon islands are isolated from each other by mesa isolation; and a plurality of transistors formed on the strained silicon islands.

In the silicon-on-insulator semiconductor device, the substrate may be formed of a semi-conducting material, or may be a silicon wafer. The insulator layer may be a dielectric material, or may be silicon oxide. The strained silicon islands have thicknesses in the range of between 10 angstroms and 500 angstroms. A strain in the strained silicon islands may be tensile in nature in a plane of the wafer, wherein the strain may have a magnitude between 0.1% and 2%. A strain in the strained silicon islands may be compressive in nature in the plane of the wafer, wherein the strain may have a magnitude between 0.1% and 2%. The strained silicon islands may have rounded corners at isolation edges.

The present invention is further directed to a method for forming strained silicon-on-insulator transistors which can be carried out by the operating steps of providing a strained silicon-on-insulator substrate including a strained silicon layer overlying an insulator layer; forming strained silicon islands in the strained silicon layer that are electrically isolated from each other by mesa isolation; and forming transistors on the strained silicon islands.

The method for forming strained silicon-on-insulator transistors may further include the step of forming the insulator layers in a material including a dielectric, or in a material including silicon oxide. The method may further include the step of forming the strained silicon layer to a thickness in the range of 10 angstroms to 500 angstroms. A strain in the strained silicon layer may be tensile in nature in a plane of the substrate, wherein a magnitude of the strain may be between about 0.1% and about 2%. A strain in the strained silicon layer may be compressive in nature in a plane of the substrate, wherein a magnitude of the strain may be between about 0.1% and about 2%.

The present invention is still further directed to a method for forming strained silicon-on-insulator transistors which can be carried out by the operating steps of providing a strained silicon-on-insulator substrate including a strained silicon layer overlying an insulator layer; forming strained silicon islands in the strained silicon layer that are electrically isolated from each other by mesa isolation; forming rounded corners on the strained silicon islands; and forming transistors on the strained silicon islands.

The method for forming strained silicon-on-insulator transistors may further include the step of forming the insulator layer in a material including a dielectric, or the step of forming the insulator layer in a material including silicon oxide. The method may further include the step of forming the strained silicon layer to a thickness in the range of 10 angstroms to 500 angstroms, wherein a strain in the strained silicon layer may be tensile in nature in a plane of the substrate. A magnitude of the tensile strain may be between about 0.1% and about 2%. A strain in the strained silicon layer may be compressive in nature in a plane of the substrate, wherein a magnitude of the strain may be between about 0.1% and about 2%. The method may further include the step of forming the rounded corners by process steps including etching, oxidation, and annealing.

BRIEF DESCRIPTION OF THE DRAWINGS

These and other objects, features and advantages of the present invention will become apparent from the following detailed description and the appended drawings in which.

DETAILED DESCRIPTION OF THE PREFERRED EMBODIMENT

In the present invention, a strained silicon on insulator structure with mesa isolation is disclosed.

Figure 1A:
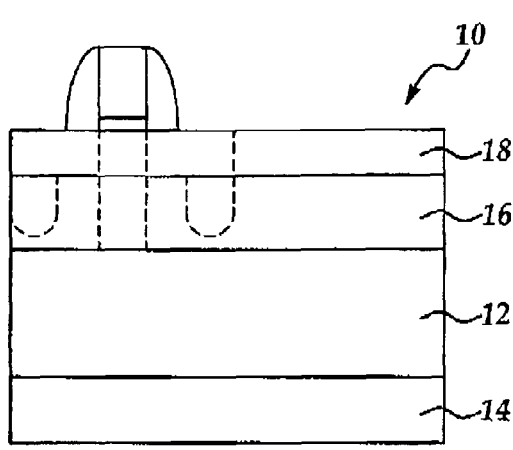
FIGS. 1A and 1B are enlarged, cross-sectional views illustrating conventional strained silicon technology implemented using a bulk substrate incorporating a thick graded silicon-germanium buffer layer.
Figure 1B:
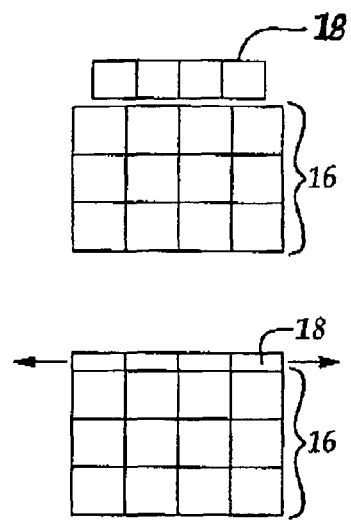

The present invention avoids the shortcomings of conventional devices and processes by disclosing a structure and a process where a strained silicon layer does not experience device isolation formation processes that require high temperatures, and where problems of liner oxide formation is eliminated. One isolation scheme without the use of high temperatures is mesa isolation. Mesa isolation relies on the formation of islands of active regions where device or transistors reside. The islands of active regions overlie an insulating substrate. Transistors residing on separate islands are therefore isolated from each other. The formation of islands of active regions does not involve high temperature steps. This is important for the retention of strain in the strained silicon layer. However, mesa isolation cannot be used in the conventional strained silicon substrate shown in FIG. 1A. This is because it is not an easily implemented process to form islands of strained silicon overlying an insulating layer using the substrate of FIG. 1A.

Figure 2A:
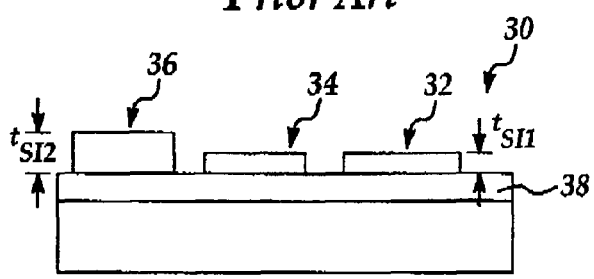
FIG. 2A is an enlarged, cross-sectional view of a present invention silicon-on-insulator semiconductor device with strained silicon islands formed on an insulator layer.
Figure 2B:
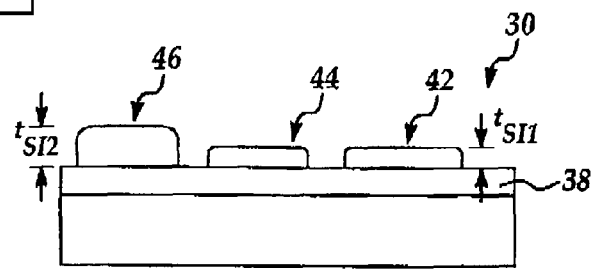
FIG. 2B is an enlarged, cross-sectional view of the present invention silicon-on-insulator semiconductor device with strained silicon islands that have rounded corners formed on an insulator layer.
Figure 2C:
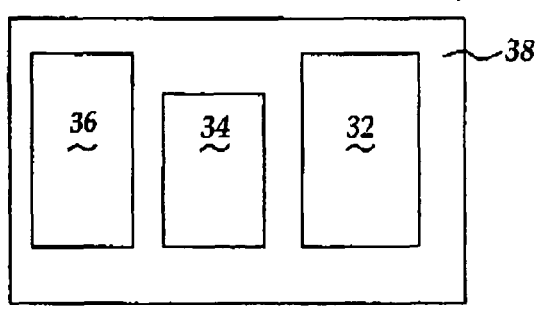
FIG. 2C is a plane view of the present invention silicon-on-insulator semiconductor device illustrating the strained silicon islands.

By using a strained silicon-on insulator substrate, it is possible to form islands of strained silicon overlying an insulator layer. A cross-sectional view of device 30 having strained silicon islands 32, 34, 36 on insulator 38 is shown in FIG. 2A. The strained silicon islands 32, 34, 36 do not need to have the same film thickness. For example, one strained silicon island may have a film thickness $t_{si1}$, and another island may have a thickness $t_{si2}$. In addition, the cross-sectional view of the islands 42, 44, 46 for device 40 may feature rounded corners, as shown in FIG. 2B. In FIG. 2C, the top view of the strained silicon islands 32, 34, 36 are shown. The islands 32, 34, 36 are electrically isolated from each other.

Figure 3A:
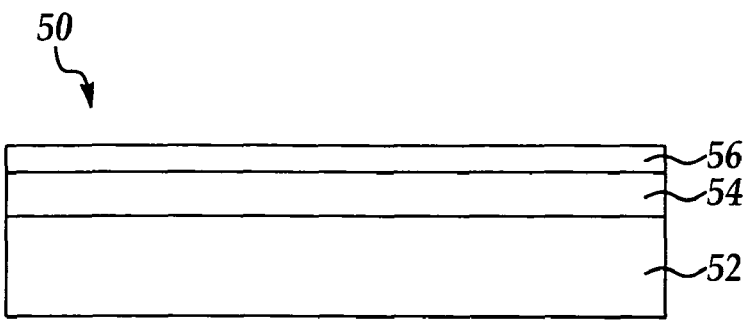
FIGS. 3A-3D are enlarged, cross-sectional views illustrating the process steps for forming strained silicon islands for the present invention silicon-on-insulator semiconductor device.

According to the present invention, a strained silicon-on-insulator transistor 50 may be fabricated by a process shown in FIGS. 3A-3D. A strained silicon-on-insulator substrate 52, 54, and 56 is used as the starting material, as shown in FIG. 3A. In the preferred embodiment, the insulator layer 54 (or buried oxide layer) is comprised of silicon oxide. The thickness of the silicon oxide is preferably between 100 angstroms and 2000 angstroms. However, it may be comprised of any other insulating material or dielectric such as silicon nitride and aluminum oxide. The substrate 52 is preferably a silicon substrate, but also may include other semiconductor substrates such as silicon-germanium substrates or gallium arsenide substrates. The strained silicon layer 56 may have a strain magnitude of between 0.1% and 2%. The strain magnitude is defined to be the percentage change in the lattice constant of the strained material from its natural lattice constant. The nature of the strain may be tensile or compressive. In the preferred embodiment, the strain is tensile in nature in the in-plane direction, that is, the lattice constant of the strained silicon layer is larger than its natural lattice constant in the plane of the wafer. The thickness of the strained silicon layer ranges from 10 angstroms to 500 angstroms which may be formed by a layer transfer technique. An example of a layer transfer technique is a wafer bonding step followed by a wafer separation step. In the wafer bonding step, a donor wafer comprising a strained silicon layer overlying a relaxed silicon-germanium layer is bonded to a target wafer comprising a silicon oxide layer overlying a silicon substrate, such that the strained silicon layer is in atomic contact with the silicon oxide layer. In the subsequent wafer separation step, the strained silicon layer is separated from the donor wafer so that a new final wafer is formed comprising a strained silicon layer overlying a silicon oxide layer which is turn overlies a silicon substrate.

Figure 3B:
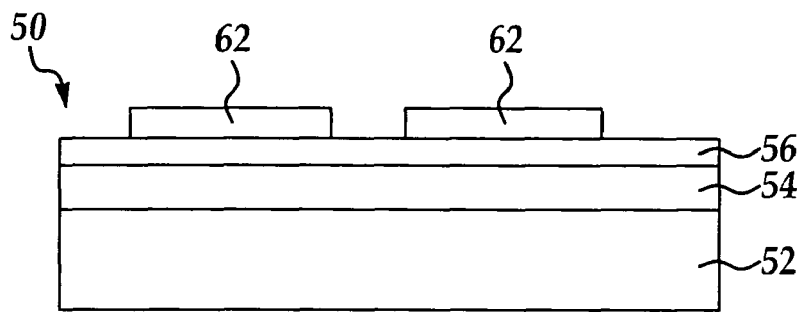
Figure 3C:
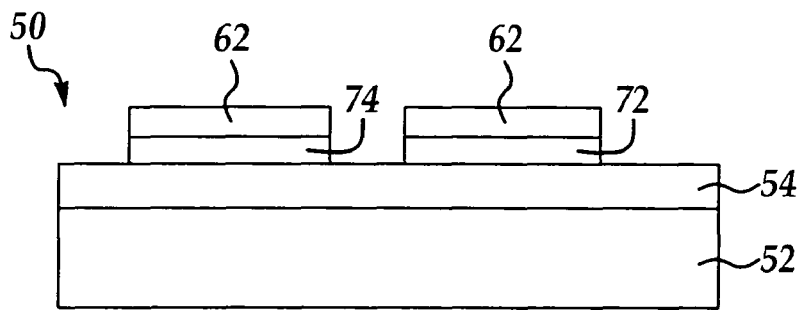

Next, a masking layer (not shown) is deposited over the strained silicon layer 56 and patterned using standard photolithographic techniques to form a mask 62. This is shown in FIG. 3B. The mask is used to define active regions 72, 74 (shown in FIG. 3C) in the strained silicon layer 56. The mask 62 may be comprised of any masking material known and used in the art, such as silicon oxide, silicon nitride, or silicon oxynitride. The mask may also be formed of a stack including a silicon nitride layer overlying a silicon oxide layer.

Figure 3D:
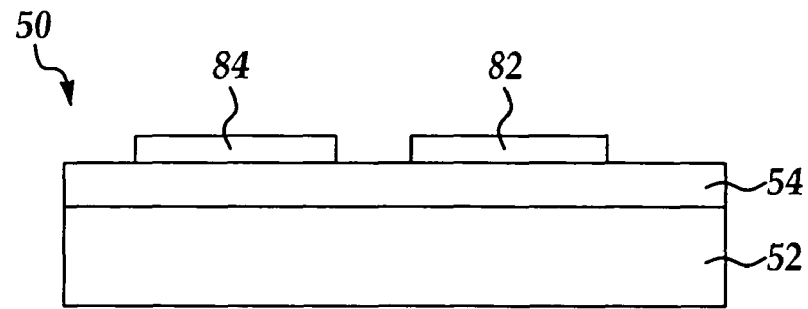

Following active region definition using the mask, the strained silicon layer 56 is etched using techniques known and used in the art. An example is a dry plasma etch using flourine chemistry. The mask 62 is then removed to yield the strained silicon islands 82, 84, the cross-sections of which are shown in FIG. 3D.

Figure 4A:
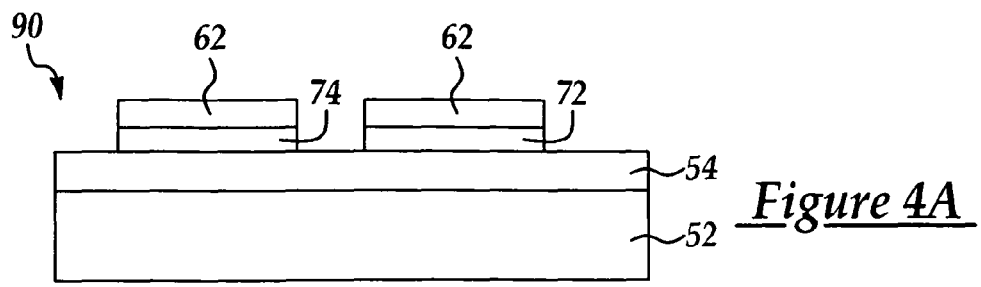
FIGS. 4A-4D are enlarged, cross-sectional view of strained silicon islands that have rounded corners for the present invention silicon-on-insulator semiconductor device.
Figure 4B:
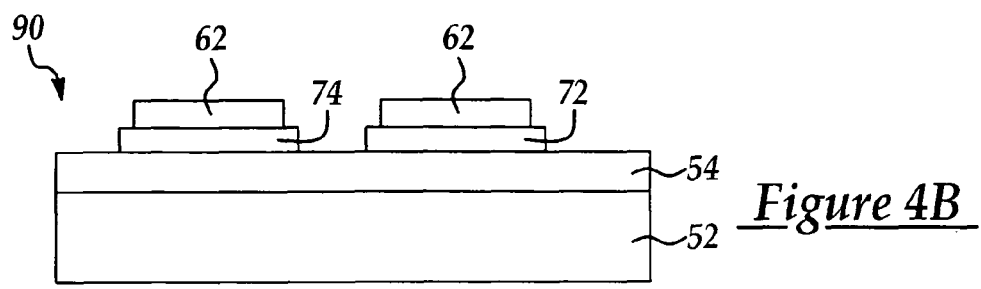
Figure 4C:
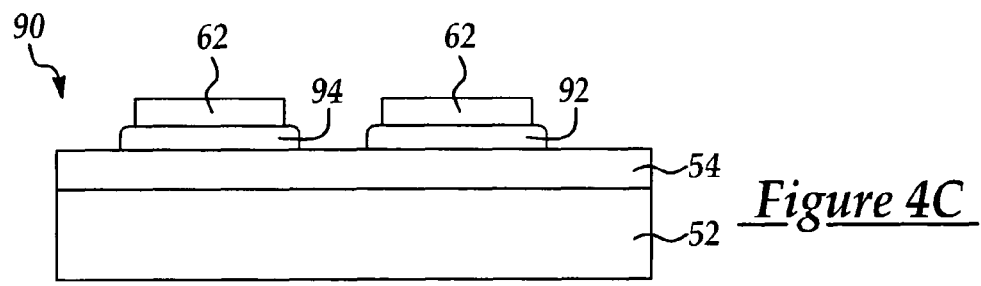
Figure 4D:
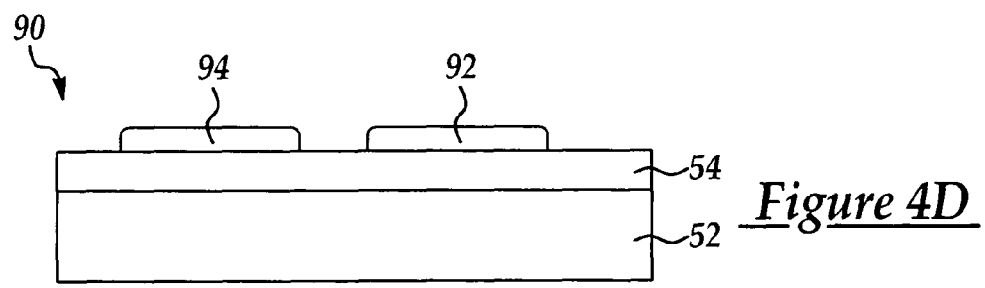

Strained silicon islands 92, 94 with rounded corners may also be formed in a slightly modified process in a second embodiment of the present invention. In the second embodiment, the process of active region definition is performed and the strained silicon layer 56 is etched, as shown in FIG. 4A. The size of the mask 62 is then slightly shrunk by etching. The result is that the edges 62 of the mask is pulled-back to reveal a portion of the strained silicon island 72, 74, as shown in FIG. 4B. A corner rounding process is then performed as shown in FIG. 4C. The corner rounding process may be an oxidation step followed by oxide removal. An example of the oxidation step is a thermal oxidation conducted at a temperature between 550 degrees Celsius to 950 degrees Celsius in an oxygen ambient. An example of the oxide removal step is a wet etch process carried out in a diluted hydrofluoric acid. Corner rounding of the active regions 72, 74 may also be achieved by various combinations of processes such as etching, oxidation, and/or annealing, performed after the active region 72, 74 definition. The mask 62 is then removed to result in strained silicon islands 92, 94 with rounded corners. This is shown in FIG. 4D. Si corner rounding at the isolation edge is a feature that helps alleviate problems associated with a double-hump in the drain current versus gate voltage (IDS-VGS) characteristic.

Figure 5:
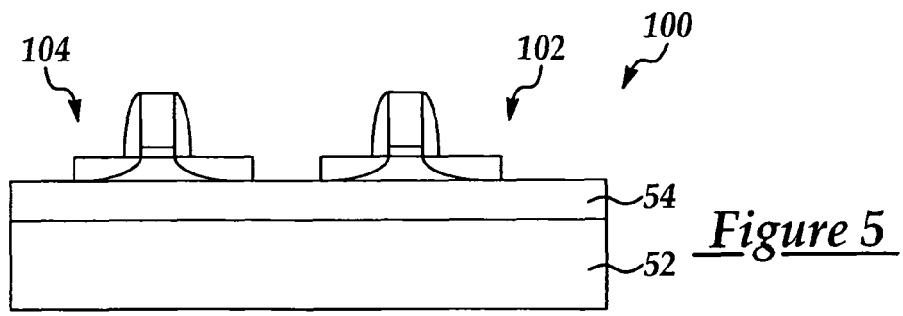
FIG. 5 is an enlarged, cross-sectional view of the present invention strained silicon transistors with mesa isolation.

Transistors may then be fabricated on the strained silicon islands using techniques known and used in the art. FIG. 5 shows a completed device 100 featuring N-channel and P-channel MOSFETs 102, 104 with strained silicon channels and electrically isolated using mesa isolation.

While the present invention has been described in an illustrative manner, it should be understood that the terminology used is intended to be in a nature of words of description rather than of limitation.

Furthermore, while the present invention has been described in terms of a preferred and an alternate embodiment, it is to be appreciated that those skilled in the art will readily apply these teachings to other possible variations of the inventions.

The embodiment of the invention in which an exclusive property or privilege is claimed are defined as follows.

What is claimed is:

1. A method for forming strained silicon-on-insulator transistors comprising steps of:
   providing a strained silicon-on-insulator substrate comprising a strained silicon layer on and contacting an insulator layer, said strained silicon-on-insulator substrate formed by transferring a strained silicon layer to said insulator layer;
   forming strained silicon islands in said strained silicon layer that are electrically isolated from each other by mesa isolation, said strained silicon islands formed by etching said strained silicon layer to said insulator layer to form said strained silicon islands laterally spaced apart from one another on said insulator layer, said strained silicon islands comprising strained silicon islands having different thickness with respect to one another; and
   forming transistors on the strained silicon islands.

2. The method of claim 1 further comprising the step of forming said insulator layer of a material comprising silicon oxide.

3. The method of claim 1 further comprising the step of forming said strained silicon layer to a thickness in the range of 10 Angstroms to 500 Angstroms.

4. The method of claim 1, wherein a strain in said strained silicon layer is tensile in nature in a plane of the substrate.

5. The method of claim 4 wherein a magnitude of said strain is between about 0.1% and about 2%.

6. The method of claim 1 wherein a strain in said strained silicon layer is compressive in nature in a plane of the substrate.

7. The method of claim 6 wherein a magnitude of said strain is between about 0.1% and about 2%.

8. The method of claim 1, further comprising the step of forming rounded corners on said strained silicon islands.

9. The method of claim 8 wherein said rounded corners are formed by process steps comprising:
   forming an oxide on said strained silicon islands; and,
   removing said oxide.

10. The method of claim 1 wherein a bottom of said strained silicon islands are about co-planar with a top of said insulator layer following formation of said transistors.

11. A method for forming strained silicon-on-insulator transistors comprising the steps of:
- providing a strained silicon-on-insulator substrate comprising a strained silicon layer on and contacting an insulator layer, said strained silicon-on-insulator substrate formed by transferring a strained silicon layer to said insulator layer;
- forming strained silicon islands in said strained silicon layer that are electrically isolated from each other by mesa isolation, said strained silicon islands formed by etching said strained silicon layer to said insulator layer to form said strained silicon islands laterally spaced apart from one another on said insulator layer, said strained silicon islands comprising strained silicon islands having different thickness with respect to one another;
- forming rounded corners on said strained silicon islands; and
- forming transistors on said strained silicon islands.

12. The method of claim 11 further comprising the step of forming said insulator layer of a material comprising silicon oxide.

13. The method of claim 11 further comprising the step of forming said strained silicon layer to a thickness in the range of 10 Angstroms to 500 Angstroms.

14. The method of claim 11, wherein a strain in said strained silicon layer is tensile in nature in a plane of the substrate.

15. The method of claim 14 wherein a magnitude of said strain is between about 0.1% and about 2%.

16. The method of claim 11 wherein a strain in said strained silicon layer is compressive in nature in a plane of the substrate.

17. The method of claim 16 wherein a magnitude of said strain is between about 0.1% and about 2%.

18. The method of claim 11 wherein said rounded corners are formed by process steps comprising:
- forming an oxide on said strained silicon islands; and,
- removing said oxide.

19. The method of claim 11 wherein a bottom of said strained silicon islands are about co-planar with a top of said insulator layer following formation of said transistors.

* * * * *